United States Patent
Muller et al.

(10) Patent No.: US 7,609,112 B2
(45) Date of Patent: Oct. 27, 2009

(54) BOOSTED TAIL-CURRENT CIRCUIT

(75) Inventors: Rikky Muller, Cambridge, MA (US); David Hall Whitney, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/105,159

(22) Filed: Apr. 17, 2008

(65) Prior Publication Data

US 2009/0195313 A1 Aug. 6, 2009

Related U.S. Application Data

(60) Provisional application No. 61/063,221, filed on Feb. 1, 2008.

(51) Int. Cl.
*H03F 3/45* (2006.01)
(52) U.S. Cl. .................. 330/261; 330/254
(58) Field of Classification Search .......... 330/261, 330/257, 253, 254
See application file for complete search history.

(56) References Cited

U.S. PATENT DOCUMENTS

| | | | | |
|---|---|---|---|---|
| 4,774,476 A | * | 9/1988 | Ecklund et al. | 330/260 |
| 5,872,483 A | * | 2/1999 | Kimura | 327/563 |
| 6,529,075 B2 | * | 3/2003 | Bruck et al. | 330/252 |
| 6,605,996 B2 | * | 8/2003 | Yu et al. | 330/253 |
| 7,443,240 B2 | * | 10/2008 | Katsunaga et al. | 330/254 |

OTHER PUBLICATIONS

Harjani, Ramesh. "An Integrated Low-Voltage Class AB CMOS OTA", IEEE JSSC (Feb. 1999) vol. 34, No. 2.

* cited by examiner

*Primary Examiner*—Henry K Choe
(74) *Attorney, Agent, or Firm*—Kenyon & Kenyon LLP

(57) ABSTRACT

A circuit includes a pair of input transistors configured as a differential pair and having input terminals configured to receive an input voltage. The circuit also includes a first current source connected to and configured to provide a first tail current to the pair of input transistors, the first tail current being a class-A current having a non-zero quiescent value. The circuit also includes a second current source connected to and configured to provide a second tail current to the pair of input transistors, the second tail current being a class-B current having a zero quiescent value and a non-zero non-quiescent value. The second current source is configured to provide the second tail current as a function of the input voltage.

20 Claims, 15 Drawing Sheets

BOOSTED TAIL-CURRENT CIRCUIT

CROSS-REFERENCE TO RELATED APPLICATIONS

This application claims priority to U.S. Provisional Patent Application No. 61/063,221, to Rikky Muller and David Hall Whitney, filed on Feb. 1, 2008, entitled "Boosted Tail-Current Circuit," which is herein incorporated by reference in its entirety.

BACKGROUND INFORMATION

FIG. 1A depicts a differential-pair circuit 20 that can be used to form an input stage of a larger circuit. The circuit 20 includes a pair of transistors N1, N2, connected as a differential pair, and a class-A current source I1. The differential-pair N1, N2 includes a first n-channel metal-oxide-semiconductor (NMOS) transistor N1 having a source connected to a source of a second NMOS transistor N2. The gates of the differential pair N1, N2 are configured to accept an input voltage, VIN, the gate of the first NMOS transistor N1 accepting a positive input voltage, VIN+, and the gate of the second NMOS transistor accepting a negative input voltage, VIN−, where VIN=VIN+−VIN−. The class-A current source I1 supplies a tail current IT1 to the differential pair N1, N2 that is always on and has a substantially constant value. Although FIG. 1A depicts an NMOS differential pair circuit 20, FIG. 1B depicts a similar p-channel metal-oxide-semiconductor (PMOS) differential-pair circuit 20B having PMOS transistors P1, P2 and a class-A current source I1B delivering a tail current IT1B.

In operation, in a quiescent condition, which for purposes of this description is one in which the input voltage VIN has a substantially zero value, the tail current IT1 supplied by the class-A current source I1 will be evenly split into currents IN1, IN2 in each of the transistors N1, N2 of the differential pair N1, N2. When the input voltage VIN becomes non-zero, the tail current IT1 will then be apportioned in greater amounts to one or the other of the input transistors N1, N2. For a positive-polarity input voltage VIN, the first NMOS transistor N1 will receive a greater portion of the tail current IT1, and for a negative-polarity input voltage VIN, the second NMOS transistor N2 will receive a greater portion of the tail current IT1. A similar apportioning of the tail current IT1B into currents IP1, IP2 in the PMOS differential pair P1, P2 occurs during the operation of the circuit 20B of FIG. 1B.

One problem, however, with the differential-pair circuit 20 depicted in FIG. 1A is that the finite, substantially constant value of the class-A current source I1 will limit the slew rate of a circuit containing the differential-pair circuit 20. The slew rate of such a containing circuit is the maximum rate of change of its output voltage. The slew rate typically depends on the size and type of load, but also depends on the amount of current available to drive the load. For a circuit that includes the differential-pair circuit 20 of FIG. 1A, the differential current ID, where ID=IN1−IN2, that results from the input voltage VIN at least in part drives successive circuit stages. In the circuit 20 of FIG. 1A, however, as the input voltage VIN becomes progressively larger, eventually all of the tail current IT1 will be apportioned to either the first or second NMOS transistor N1 or N2. Therefore, because the class-A current source I1 has a finite, substantially constant value, the differential current ID will be limited to a maximum value equal to that of the tail current IT1. This maximum limit of the differential current ID will in turn limit the degree to which succeeding stages can be driven, which typically manifests as a slew rate limit or output current limit of the overall circuit.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

Figures 1A, 1B:
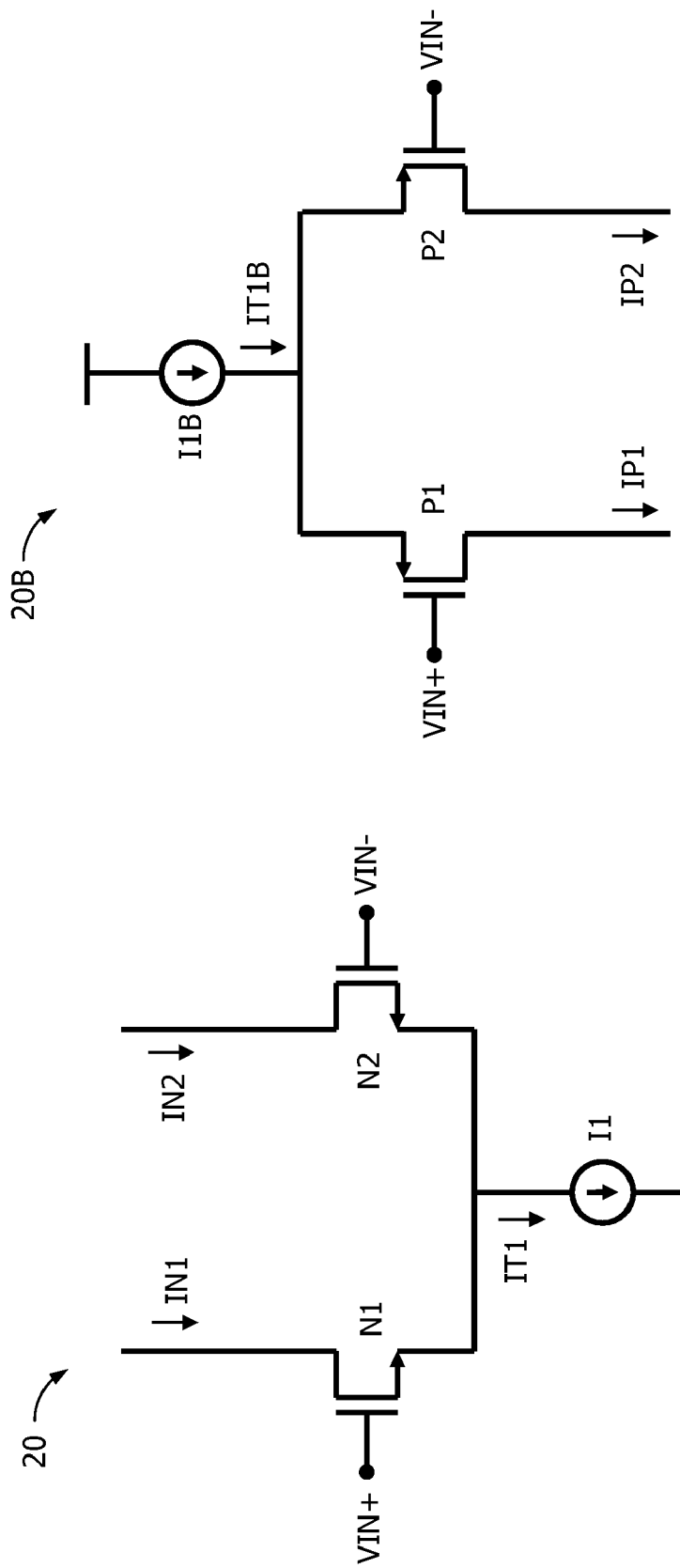
FIG. 1A is a circuit schematic depicting an embodiment of a prior-art NMOS differential-pair circuit.
FIG. 1B is a circuit schematic depicting an embodiment of a prior-art PMOS differential-pair circuit.
Figures 2A, 2B:
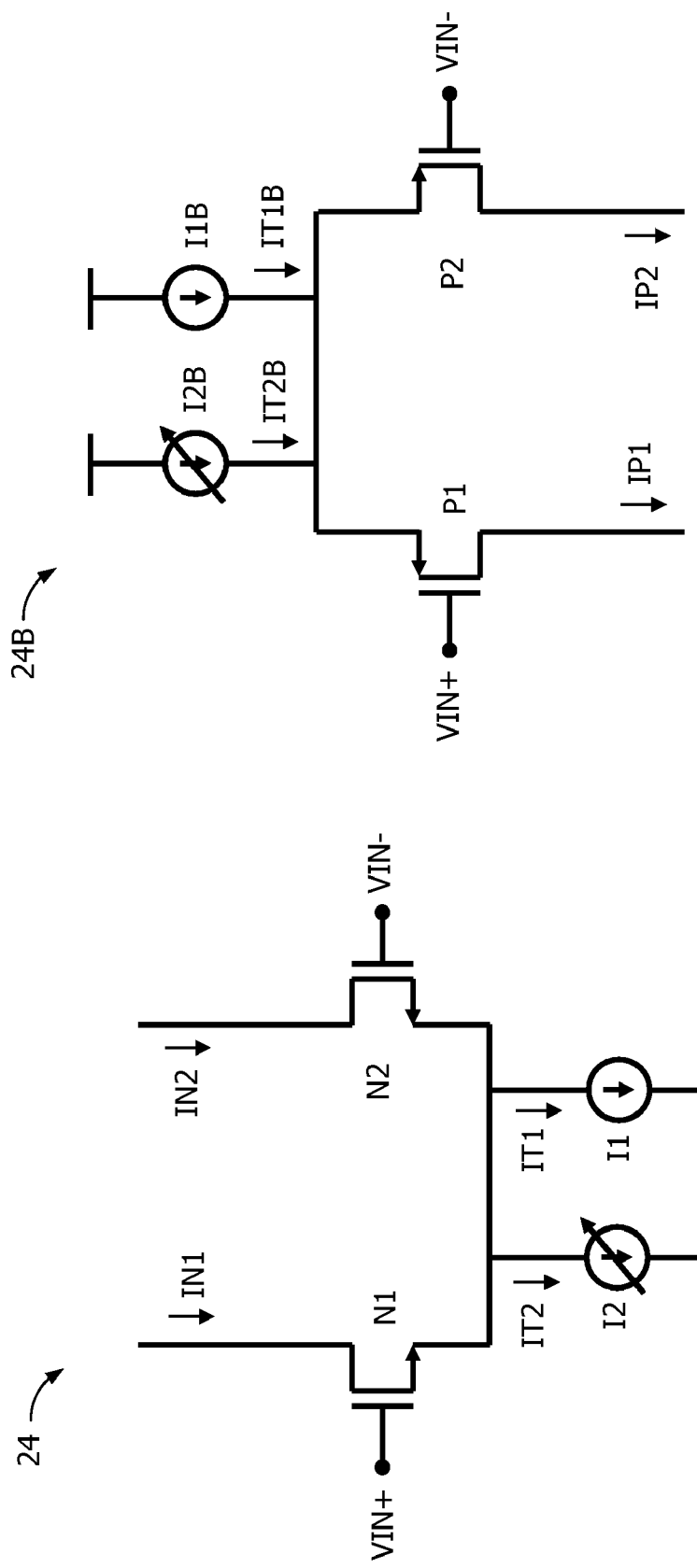
FIG. 2A is a circuit schematic depicting an embodiment of a boosted tail-current circuit having an NMOS differential pair.
FIG. 2B is a circuit schematic depicting an embodiment of the boosted tail-current circuit having a PMOS differential pair.

FIG. 2A depicts an embodiment of a circuit 24 having a boosted tail-current that is capable of achieving an enhanced differential current ID, relative to the differential-pair circuit 20 of FIG. 1A, for a given quiescent power consumption. The depicted boosted tail-current circuit 24 includes the pair of input transistors N1, N2 configured as a differential pair N1, N2, similar to that shown in FIG. 1A, including the first NMOS transistor N1 and the second NMOS transistor N2, the first NMOS transistor N1 having its source connected to the source of the second NMOS transistor N2. The gates of the first and second NMOS transistors N1, N2 are again configured to accept the input voltage VIN, where VIN=VIN+−VIN−. Also in a similar manner to the circuit of FIG. 1A, the first current source I1 supplies the class-A tail current IT1 to the differential pair N1, N2. The class-A first current source I1 delivers a substantially constant, always-on first tail current IT1 having a non-zero quiescent value.

In contrast to the circuit 20 of FIG. 1A, the boosted tail-current circuit 24 of FIG. 2A is also supplied with a second tail current IT2 from a second current source I2, an input-voltage-controlled class-B current source I2. The second current source I2 is a class-B current source I2 in which the second tail current IT2 has a substantially zero quiescent value and a non-zero non-quiescent value. The second current source I2 is also an input-voltage-controlled current source I2 in which the second tail current IT2 is a function of the input voltage VIN applied across the input terminals of the differential pair N1, N2. The non-quiescent value of the second tail current IT2 can also be a non-constant non-quiescent value, and can be either a linear or non-linear function of the input voltage VIN. Considered collectively, the first and second current sources I1, I2 provide a collective tail current ITC, where ITC=IT1+IT2, which is a class-AB tail current ITC that can have a substantially-constant non-zero quiescent value and a non-zero non-constant non-quiescent value.

The embodiment of the boosted tail-current circuit 24 depicted in FIG. 2A includes the NMOS differential-pair input transistors N1, N2. However, FIG. 2B depicts another embodiment of the boosted tail-current circuit 24B that includes the PMOS differential-pair input transistors P1, P2, and class-A current source I1B similar to that shown in FIG. 1B, as well as an input-voltage-controlled current source I2B. For purposes of this description, the structure and operation of the embodiment of the boosted tail-current circuit 24 depicted in FIG. 2A will be described in detail, with it understood that the embodiment 24B depicted in FIG. 2B is structured and operates similarly, in general with NMOS transistors replaced by PMOS transistors, and vice versa. Other embodiments of the boosted tail-current circuit 24 also exist in which the differential pair is implemented with bipolar junction transistors. Some of these embodiments are discussed in further detail below.

Figure 3A:
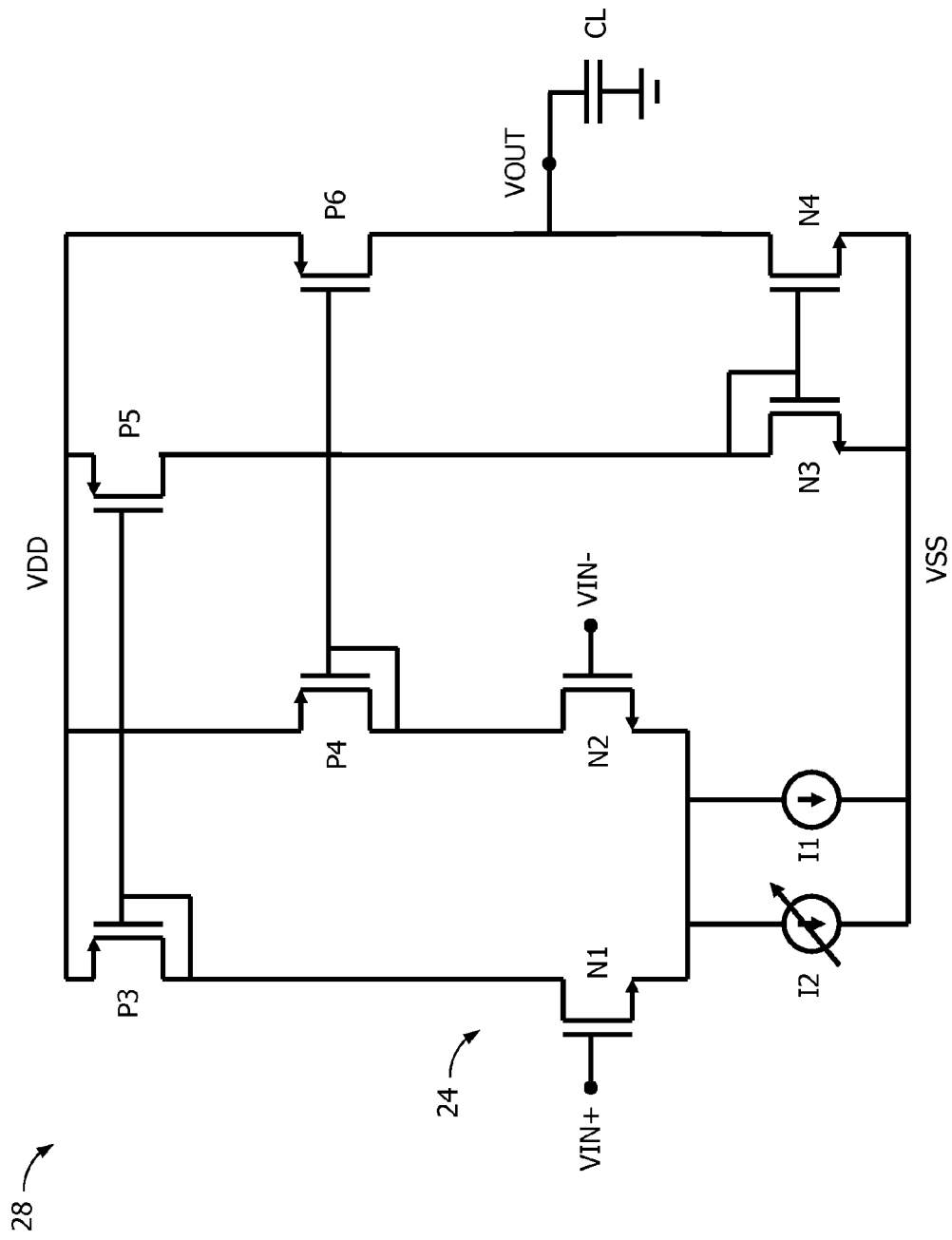
FIG. 3A is a circuit schematic depicting an embodiment of an amplifier including the boosted tail-current circuit depicted in FIG. 2A.

The boosted tail-current circuit 24 can be used as a stage in other circuits. For example, the boosted tail-current circuit 24 can be used as an input stage of an amplifying circuit. FIG. 3A depicts an embodiment of an amplifying stage 28 having the boosted tail-current circuit 24 as an input stage. In the depicted embodiment, the amplifying stage 28 includes active-load PMOS transistors P3, P4 that are driven by the differential current ID (where ID=IN1−IN2) in the differential pair N1, N2 as a result of the input voltage VIN. The amplifying stage 28 also includes intervening transistors P5 and N3, which taken together with output transistors P6 and N4, convert the differential nature of the current and voltage in the active load transistors P3, P4 to a single-ended output voltage VOUT at the drains of the output transistors P6, N4. The amplifying stage 28 is depicted driving a load capacitance CL. Other types of loads are also possible. Note that the input voltage VIN across the input terminals of the differential pair N1, N2 can be either a true differential signal, in which both the positive and negative input voltages VIN+ and VIN− vary, or an effectively single-ended signal, in which one or the other of the positive and negative input voltages VIN+ and VIN− is held at a fixed value while the other varies.

Through the use of the boosted tail-current circuit 24, the amplifying stage 28 depicted in FIG. 3A is able to achieve a faster response by overcoming the slew rate limit of the output voltage VOUT in comparison to an amplifying stage having the prior art differential-pair circuit 20 of FIG. 1A instead of the boosted tail current circuit 24, for a given quiescent value of the first tail current IT1 and a given value of the load capacitance CL.

Figure 3B:
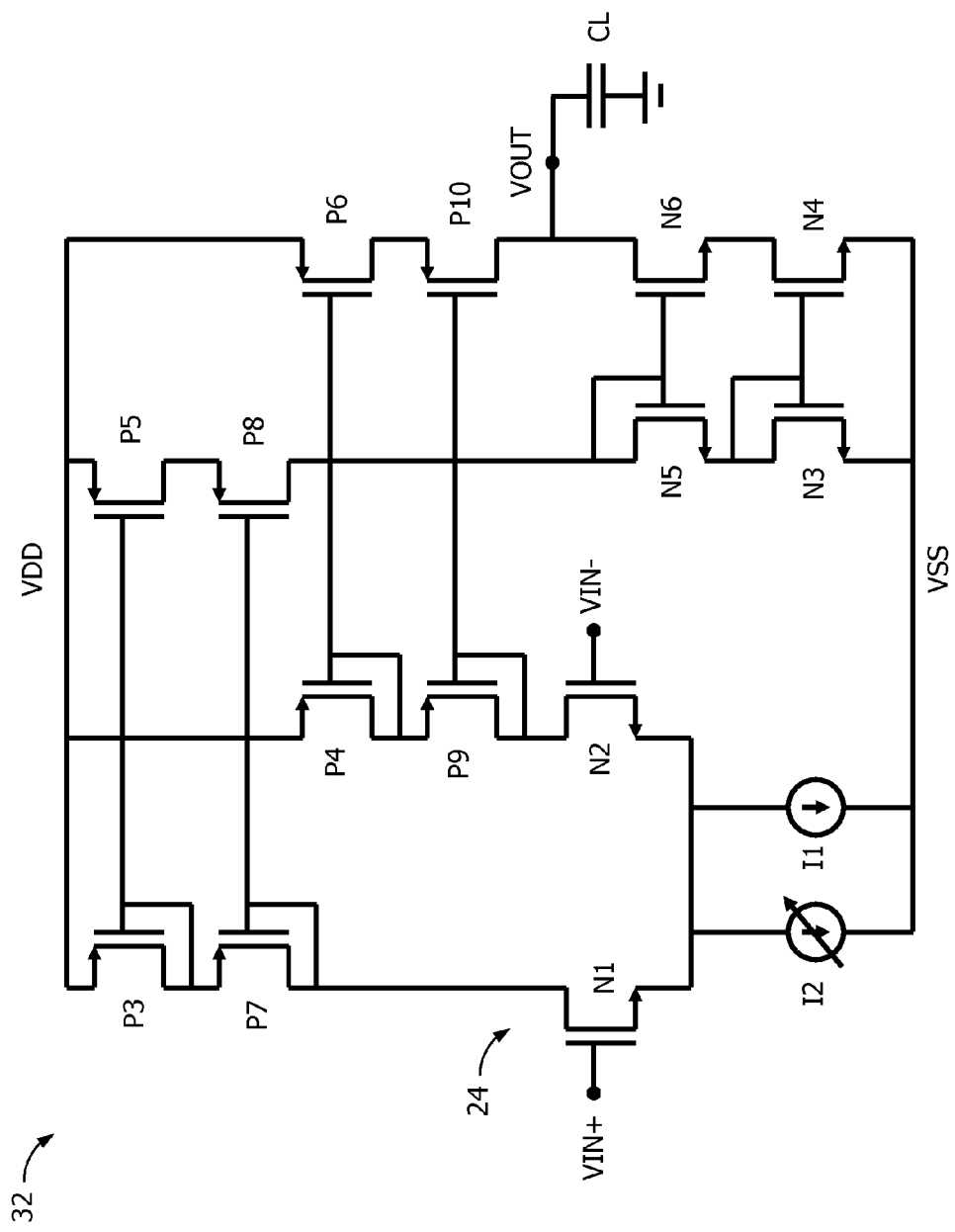
FIG. 3B is a circuit schematic depicting another embodiment of an amplifier including the boosted tail-current circuit depicted in FIG. 2A.

The boosted tail-current circuit 24 can be included in many types of circuits and can, generally speaking, be used to replace the differential-pair circuit 20 of FIG. 1A wherever it appears. For example, many different embodiments of amplifying stages having the boosted tail-current circuit 24 are possible. FIG. 3B depicts another exemplary embodiment of an amplifying stage 32 having the boosted tail-current circuit 24. In comparison to FIG. 3A, the amplifying stage 32 of FIG. 3B includes cascode PMOS transistors P7, P8, P9, P10 and cascode NMOS transistors N5, N6 that can be used to boost the overall gain of the amplifying stage 32. The boosted tail-current circuit 24 is compatible with many different types of amplifying stage architectures.

Figure 4:
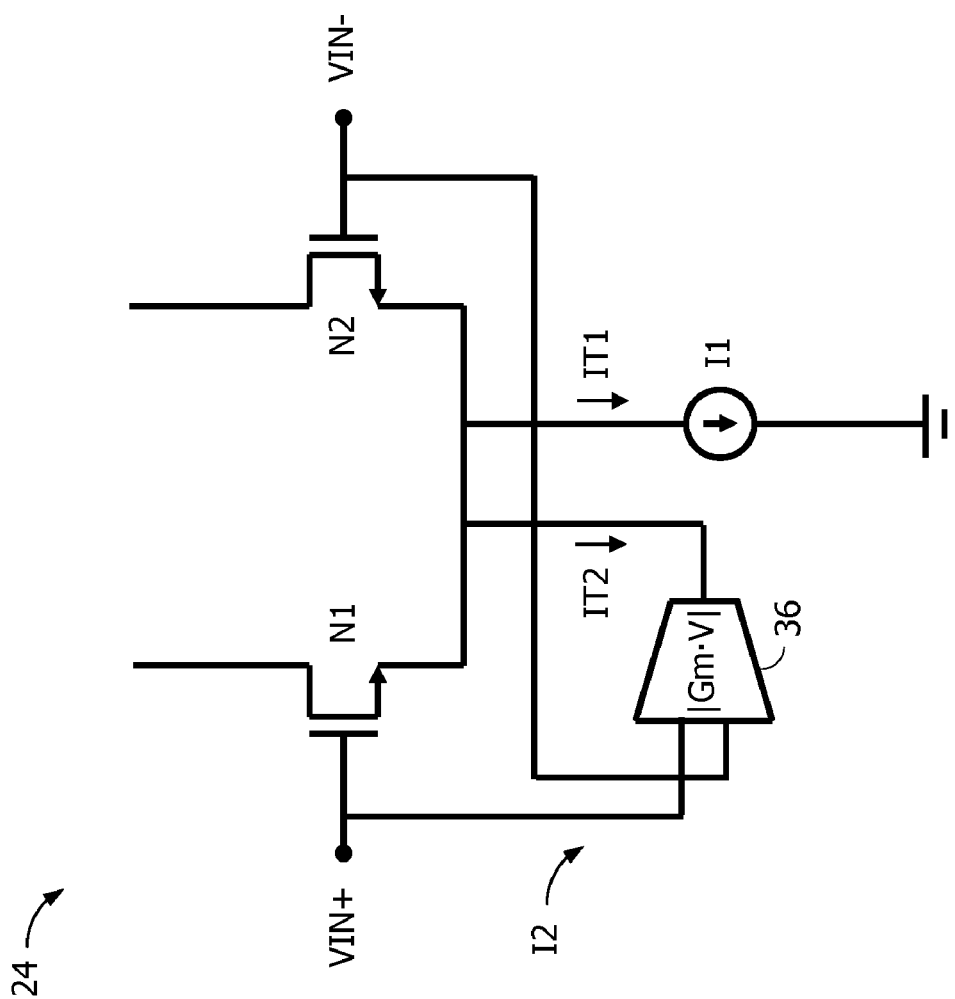
FIG. 4 is a circuit schematic depicting an embodiment of the boosted tail current circuit depicted in FIG. 2A.

FIG. 4 depicts an embodiment of the boosted tail-current circuit 24 depicted in FIG. 2A. In the embodiment of FIG. 4, the input-voltage-controlled class-B second current source I2 is implemented with an absolute-value transconductor 36. As depicted in FIG. 4, the absolute-value transconductor has a differential input configured to receive the input voltage VIN, and a single-ended output configured to deliver the second tail current IT2. A transconductor produces a current at its output that is a function of a voltage at its input, and conventionally produces an output current that has a polarity, i.e., positive or negative, which is related to a polarity of the input voltage. For example, if a conventional transconductor has a transfer function of $\Delta IO = GM*\Delta VI$, where $\Delta IO$ is a change in the output current, $\Delta VI$ is a change in the input voltage, and GM is a transconductance, then the change in the output current $\Delta IO$ has a positive value for a positive value of the change in the input voltage $\Delta VI$, and a negative value for a negative value of the change in the input voltage $\Delta VI$.

By contrast, the transconductor 36 of FIG. 4 is an absolute-value transconductor 36 that produces a positive change in an output current for either a positive or negative change in an input voltage. That is, the absolute-value transconductor 36 produces a change in the output current which is a function of the absolute value of the change in the input voltage, implementing a transfer function of $\Delta IO = |GM*\Delta VI|$. Using the specific currents and voltages as arranged in FIG. 4, the absolute-value transconductor 36 produces a change in the second tail current IT2 which is a function of the absolute value of the change in the input voltage VIN, implementing a transfer function of $IT2 = |GM*VIN|$. The absolute-value transconductor 36 of the boosted tail-current circuit 24 thus provides an implementation of the class-B second current source I2 that will function effectively for either a positive-polarity or negative-polarity input voltage VIN.

Figure 5:
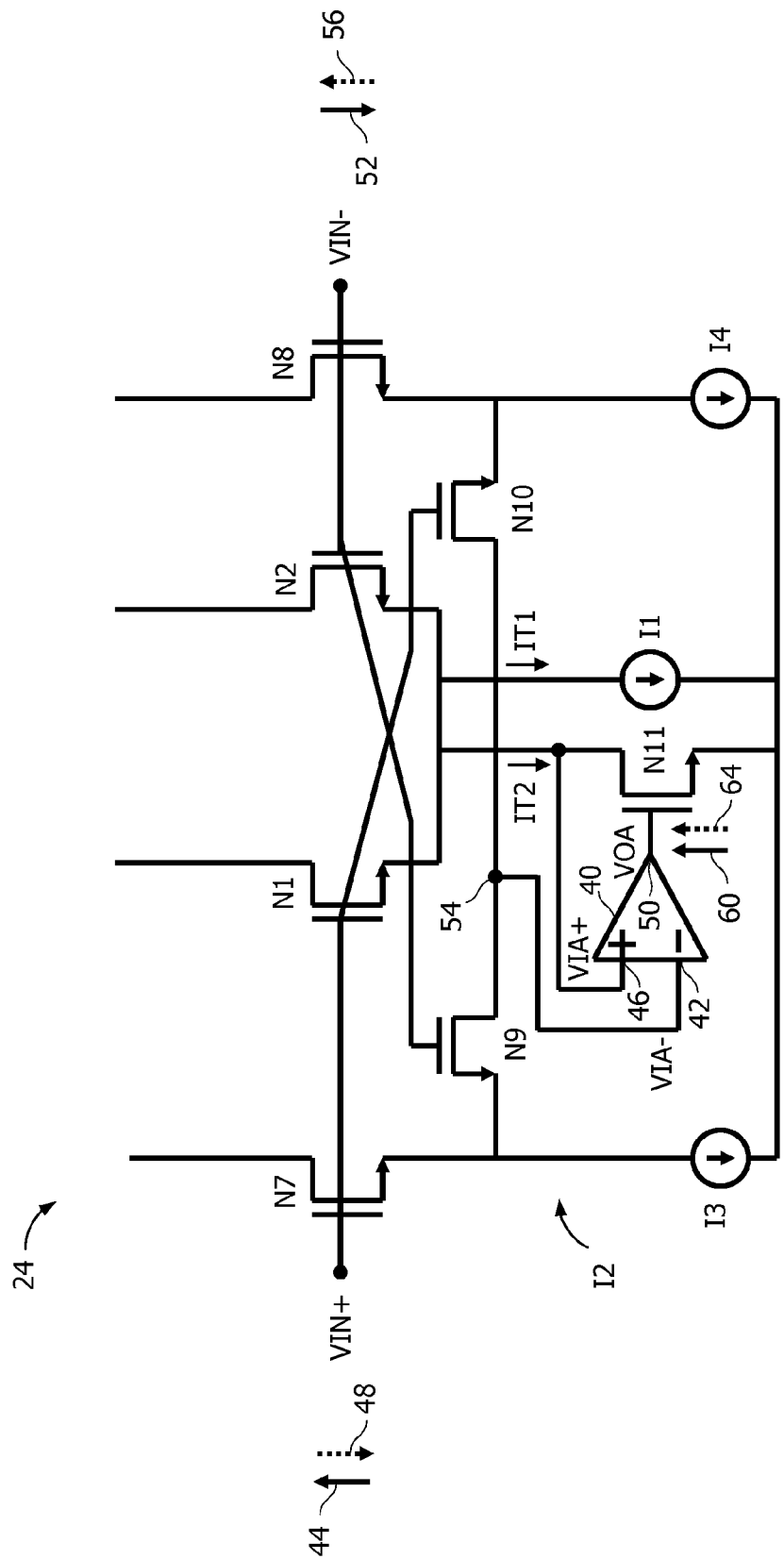
FIG. 5 is a circuit schematic depicting an embodiment of the boosted tail-current circuit depicted in FIGS. 2A and 4.

FIG. 5 depict an embodiment of the boosted tail-current circuit 24 of FIGS. 2A and 4. In the depicted embodiment, the input-voltage-controlled class-B second current source I2 (i.e., the absolute value transconductor 36 configured as depicted in FIG. 4) includes a first pair of NMOS transistors N7, N8, a second pair of NMOS transistors N9, N10, a feedback amplifier 40 and a current-supplying NMOS transistor N11. However, although FIG. 5 depicts an embodiment of the boosted tail-current circuit 24 in which the differential-pair input transistors N1, N2, and transistors of the second current source I2, including the first pair of transistors N7, N8, the second pair of transistors N9, N10, and the current-supplying transistor N11, are NMOS transistors, other embodiments exist in which these transistors can be PMOS transistors. That is, another embodiment of the boosted tail-current circuit of FIG. 5 exists in which all NMOS transistors are instead PMOS transistors (and vice versa for any PMOS transistors of FIG. 5 such as may be contained in embodiments of the feedback amplifier 40), and the configuration is symmetrically rearranged as is known for translating circuits between NMOS and PMOS transistors (and vice versa).

Concentrating on the specific embodiment depicted in FIG. 5, both the first and second pairs of NMOS transistors N7, N8 and N9, N10 have gates connected to the same circuit node as the gates of the differential-pair input transistors N1, N2, and are thus configured to receive the same input voltage VIN. Each of the first pair of NMOS transistors N7, N8 has a source connected to a source of one of the second pair of NMOS transistors N9, N10, with each of the source-connected pairs of transistors configured to receive a different one of the positive or negative input voltages VIN+ or VIN−. That is, the leftmost (as depicted in FIG. 5) transistor N7 of the first pair of NMOS transistors N7, N8 that is configured to receive the positive input voltage VIN+ has its source connected to the source of the leftmost (as depicted in FIG. 5) transistor N9 of the second pair of NMOS transistors N9, N10 that is configured to receive the negative input voltage VIN−, and symmetrically likewise for the rightmost (as depicted in FIG. 5) transistors N8, N10 of the first pair and second pairs of NMOS transistors N7, N8 and N9, N10. Each transistor of the second pair of NMOS transistors N9, N10 also has its drain connected to the drain of the other transistor of the second pair of NMOS transistors N9, N10. The connected-source pair of transistors N7, N9 and N8, N10 are provided with currents from current sources I3 and I4.

The feedback amplifier 40 is configured to receive a differential input voltage VIA and produce a single ended output voltage VOA at an output terminal 50. The differential input voltage is received as a positive amplifier input voltage VIA+ a positive input terminal 46 and a negative amplifier input voltage VIA− a negative input terminal 42. The feedback amplifier 40 implements a transfer function of VOA=(VIA+−VIA−)*A, where A is the voltage gain of the amplifier 40. In the embodiment of FIG. 5, the negative input terminal 42 of the feedback amplifier 40 is connected to the drains of the second pair of NMOS transistors N9, N10, the positive input terminal 46 is connected to a drain of the current-supplying NMOS transistor N11, and the output terminal 50 is connected to a gate of the current-supplying NMOS transistor N11.

Figures 6, 7:
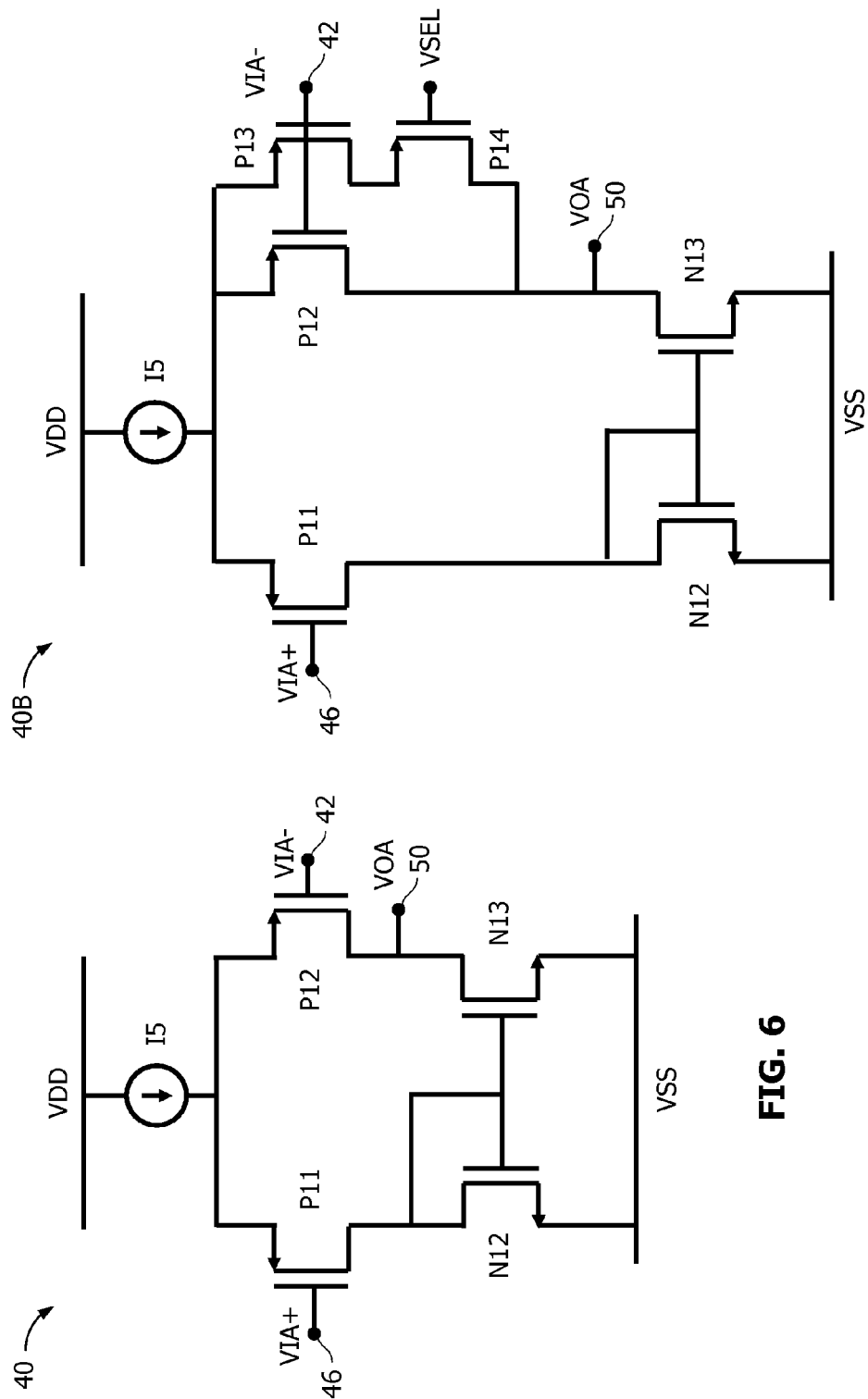
FIG. 6 is a circuit schematic depicting an embodiment a feedback amplifier of the boosted tail-current circuit depicted in FIG. 5.
FIG. 7 is a circuit schematic depicting an embodiment the feedback amplifier configured to receive a offset-voltage selection signal.

FIG. 6 depicts an exemplary embodiment of the feedback amplifier 40. The exemplary embodiment includes PMOS differential-pair input transistors P11, P12, a current source I5 that provides the input transistors P11, P12 with a tail current, and NMOS active load transistors N12, N13 configured to perform a differential-to-single-ended conversion to produce the amplifier output voltage VOA at the output terminal 50 of the amplifier 40. Note that, although the specific embodiment of FIG. 6 depicts a suitable configuration of the feedback amplifier 40, and may be advantageous due to its relative simplicity, numerous other possible amplifier configurations exist. That is, any amplifier configuration having a differential input and a single-ended output, and implementing the transfer function of VOA=(VIA+−VIA−)*A, can be used. Furthermore, as discussed above, for embodiments of the boosted tail-current circuit 24 in which the NMOS transistors of FIG. 5 are replaced with PMOS transistors, another embodiment of the feedback amplifier 40 can be used in which the NMOS and PMOS transistors of FIG. 6 are replaced with PMOS and NMOS transistors, respectively, and symmetrically rearranged (as is known for translating between PMOS and NMOS transistors and vice versa).

Returning to FIG. 5, the current-supplying NMOS transistor N11 is connected to the feedback amplifier 40 as described above, and also has its drain connected to the sources of the differential-pair input transistors N1, N2. The current-supplying NMOS transistor N11 thus supplies the second drain current IT2 to the differential-pair input transistors N1, N2.

The configuration of the input-voltage-controlled second current source I2 depicted in FIG. 5 operates to deliver an increasing class-B tail current IT2 to the differential-pair input transistors N1, N2 when either an increasing positive-polarity input voltage VIN or an increasing negative-polarity input voltage VIN is received at the gates of the input transistors N1, N2, as discussed above in regard to the absolute-value transconductor 36 of FIG. 4. The operation of the embodiment depicted in FIG. 5 can be understood on one level by examining the effect of different polarities of the input voltage VIN.

If an increasing positive-polarity input voltage VIN is received at the gates of the differential-pair input transistors N1, N2, this will result in an increasing second tail current IT2 supplied by the current-supply NMOS transistor N11. This scenario is indicated in FIG. 5 by the solid-line arrows. A first solid-line arrow 44 indicates an increasing positive input voltage VIN+ received at the gate of the first input transistor N1, and a second solid-line arrow 52 indicates a decreasing negative input voltage VIN− received at the gate of the second input transistor N2, which collectively represents an increasing positive-polarity input voltage VIN. The effect of the increasing positive-polarity input voltage VIN at the gate of the current-supplying NMOS transistor N11 is shown by a third solid-line arrow 60. That is, the increasing positive-polarity input voltage VIN produces an increasing voltage at the gate of the current-supplying NMOS transistor N11, which produces an increasing second tail current IT2 supplied by the current-supplying NMOS transistor N11.

This scenario can also be understood at the level of the operation of the components of the boosted tail-current circuit 24 of FIG. 5. In response to the increasing positive input voltage VIN+ and decreasing negative input voltage VIN−, the rightmost (as depicted in FIG. 5) transistor N8 of the first pair of NMOS transistors N7, N8 will have a relatively decreased voltage drive across its gate and source, whereas the rightmost (as depicted in FIG. 5) transistor N10 of the second pair of NMOS transistors N9, N10 will have a relatively increased voltage drive across its gate and source. This will cause the rightmost transistor N10 of the second pair of NMOS transistors N9, N10 to begin to conduct relatively more of the current provided by the current source I4 supplying current to these rightmost source-connected first- and second-pair transistors N10, N8 (and thus relatively less of this current flows into the rightmost transistor N8 of the first pair of NMOS transistors N7, N8). This, in turn, causes the rightmost transistor N10 of the second pair of NMOS transistors N9, N10 to pull down the voltage at the connected-drain node 54, decreasing this voltage.

The decreased voltage at the connected-drain node 54 feeds into the negative input terminal 42 of the feedback amplifier 40. Because of the inversion provided by the current-supplying transistor N11, a negative feedback loop is formed as signals travel from the positive input terminal 46 of the feedback amplifier 40, through the feedback amplifier 40 to the feedback amplifier output 50, from the gate of the current-supplying NMOS transistor N11 to the drain of the current-supplying NMOS transistor N11, and back again to the positive input terminal 46 of the feedback amplifier 40. Therefore, due to the gain A of the feedback amplifier 40, the effect of this negative feedback loop will be to tend to regulate the voltage VIA+ at the positive input terminal 46 toward the voltage VIA− fed to the negative input terminal 42 from the connected-drain node 54 as a result of the increasing positive-polarity input voltage VIN. The degree to which the feedback loop regulates the voltage VIA+ at the positive amplifier input terminal 46 to the voltage VIA− at the negative amplifier input terminal 42 is a function the magnitude of the gain A of the feedback amplifier 40 as well as an input-referred offset voltage of the feedback amplifier 40.

However, because the decreasing voltage at the connected-drain node 54 feeds into the negative input terminal 42 of the feedback amplifier 40, a signal inversion occurs at the output terminal 50 of the feedback amplifier 40, and so an increasing output voltage VOA results at the gate of the current-supplying NMOS transistor N11. This increasing gate voltage results in an increasing second tail current IT2 in response to the increasing positive-polarity input voltage VIN.

FIG. 5 also depicts with dashed-line arrows a second scenario in which an increasing negative-polarity input voltage VIN is received at the gates of the differential-pair input transistors N1, N2 of the boosted tail-current circuit 24. A first dashed-line arrow 48 indicates a decreasing positive input voltage VIN+ received at the gate of the first input transistor N1 and a second dashed-line arrow 56 indicates an increasing negative input voltage VIN− received at the gate of the second input transistor N2, which collectively represents an increasing negative-polarity input voltage VIN. The effect of the increasing negative-polarity input voltage VIN at the gate of the current-supplying transistor N11 is shown by a third dashed-line arrow 64. As indicated in FIG. 5, although the solid-line arrows 44, 52 and dashed-line arrows 48, 56 point in different directions at the gates of the input transistors N1, N2, the resulting effect at the gate of the current-supplying NMOS transistor N1 is the same in either scenario, shown by the third solid-line arrow 60 and the third dashed-line arrow 64. That is, both an increasing positive-polarity input voltage VIN and an increasing negative-polarity input voltage VIN produces an increasing voltage at the gate of the current-supplying NMOS transistor N11, which producing an increasing second tail current IT2 supplied by the current-supplying NMOS transistor N11. Thus, the effect of the absolute-value transconductor 36, as configured in FIG. 4, is implemented by the embodiment of FIG. 5.

The scenario represented by the first, second and third dashed-line arrows 48, 56, 64 in FIG. 5, can be understood in a similar manner to the scenario represented by the solid arrows 44, 52, 60. The operation of the components of FIG. 5 is similar in each scenario, except that in the dashed-line scenario, it is the leftmost (as depicted in FIG. 5) transistor N9 of the second pair of NMOS transistors N9, N10 that pulls down the voltage at the connected-drain node 54. In response to the decreasing positive input voltage VIN+ and increasing negative input voltage VIN−, the leftmost (as depicted in FIG. 5) transistor N9 of the second pair of NMOS transistors N9, N10 will have a relatively increased voltage drive across its gate and source, which will cause this leftmost transistor N9 of the second pair of NMOS transistors N9, N10 to begin to conduct relatively more of the current provided by the current source I3, which in turn causes this leftmost transistor N9 to pull down on the voltage at the connected-drain node 54. This decreased voltage at the connected-drain node 54 again feeds into the negative input terminal 42 of the feedback amplifier 40, which then produces the same effect as discussed above for the first scenario, i.e., an increasing voltage at the gate of the current-supplying NMOS transistor N11, which results in an increasing second tail current IT2 in response to the increasing negative-polarity input voltage VIN.

Thus, for both an increasing positive-polarity input voltage VIN and an increasing negative-polarity input voltage VIN, the boosted tail-current circuit 24 of FIG. 5 provides an increasing second tail current IT2. This increasing second tail current IT2 is thus a function of the absolute value of the input voltage VIN.

The input-voltage-controlled second current source I2 is also a class-B second current source I2, as already discussed above. The class-B nature of the second current source I2 can be implemented in the embodiment of the boosted tail-current circuit 24 of FIG. 5 by controlling the input-referred offset voltage of the feedback amplifier 40. One way of understanding the input-referred offset voltage of an amplifier is to consider it to the be input voltage necessary to produce a zero amplifier output voltage. In an ideal amplifier, implementing the transfer function of VOA=(VIA+−VIA−)*A, this input voltage (producing a zero output voltage) would be zero. However, as a practical reality, most amplifiers have small imbalances, such as for example slightly differently-sized transistors on either side of a differential signal path, that predilect the operation of the amplifier to one side or other of the differential signal path, resulting in a non-zero input voltage being required to produce a zero output voltage. This non-zero input voltage is known as the offset voltage, or input-referred offset voltage, and can be undesirable and efforts are typically made to minimize it. The offset voltage also manifests itself in the voltage difference between the input terminals of an amplifier in a negative feedback loop.

In the embodiment of FIG. 5, the offset voltage can be used to implement the class-B nature of the second current source I2 by providing a way to predetermine the turn-on point of the second current source I2. As discussed above, as the drain-connected node 54 falls in voltage as a result of an increasing positive-polarity or negative-polarity input voltage VIN, the current-supplying NMOS transistor N11 provides an increasing second tail current IT2. The drain-connected node 54 is thus effectively a control node for the negative feedback loop, and due to the configuration of the boosted tail-current circuit 24 in FIG. 5, when the voltage of the drain-connected node 54 is above a certain threshold, the feedback loop is not operating and the current-supplying NMOS transistor N11 is shut off, and when the voltage of the drain-connected node 54 is below the certain threshold, the feedback loop operates and the current-supplying NMOS transistor N11 turns on and provides the second tail current IT2. This threshold associated with the voltage of the drain-connected node 54, and thus with the magnitude of the input voltage VIN, in turn is a function of the input-referred offset voltage of the feedback amplifier 40. Therefore, the turn-on threshold, as measure in magnitude of the input voltage VIN, of the class-B second current source I2 can be predetermined by selecting the offset voltage of the feedback amplifier 40.

The offset voltage of the feedback amplifier 40 can be selected in various different ways. In one embodiment, the input transistors P11, P12 of the feedback amplifier 40 can be purposely differently-sized to select an offset voltage. In another embodiment, additional transistors can be added in parallel to one or both of the input transistors P11, P12 to produce a certain predetermined threshold of the input voltage VIN. The offset voltage of the feedback amplifier 40 can also be a selectable operating parameter of the boosted tail-current circuit 24. For example, the feedback amplifier 40 can be configured to receive a selection signal VSEL to control its offset voltage, and thereby control as an operating parameter the magnitude of the input voltage VIN at which the class B current source begins to provide the second tail current IT2.

FIG. 7 depicts one embodiment of the feedback amplifier 40 that accepts the selection signal VSEL at the gate of a PMOS selection transistor P14 to selectively switch in and out of operation an additional input transistor P13 configured to receive the amplifier negative input voltage VIA− in parallel with the other negative input transistor P12. The selection transistor P14 functions as a switch to switch the additional input transistor P13 into or out of operation. Other feedback amplifier configurations, in which additional input transistors are switched into and out of operation in response to selection signals, are also possible.

One advantage of the embodiment of the boosted tail-current circuit 24 of FIG. 5 is that it only requires a single feedback amplifier 40 to control the voltage supplied to the gate of the current-supply NMOS transistor N11. Another advantage of the embodiment of FIG. 5 is that it doesn't require additional voltage headroom over that required by the class-A first current source I1. Another advantage of the embodiment of FIG. 5 is that the separate class-A first current source I1 and class-B second current source I2 may each be separately designed to optimize the characteristics of the overall boosted tail-current circuit 24.

Figure 8A:
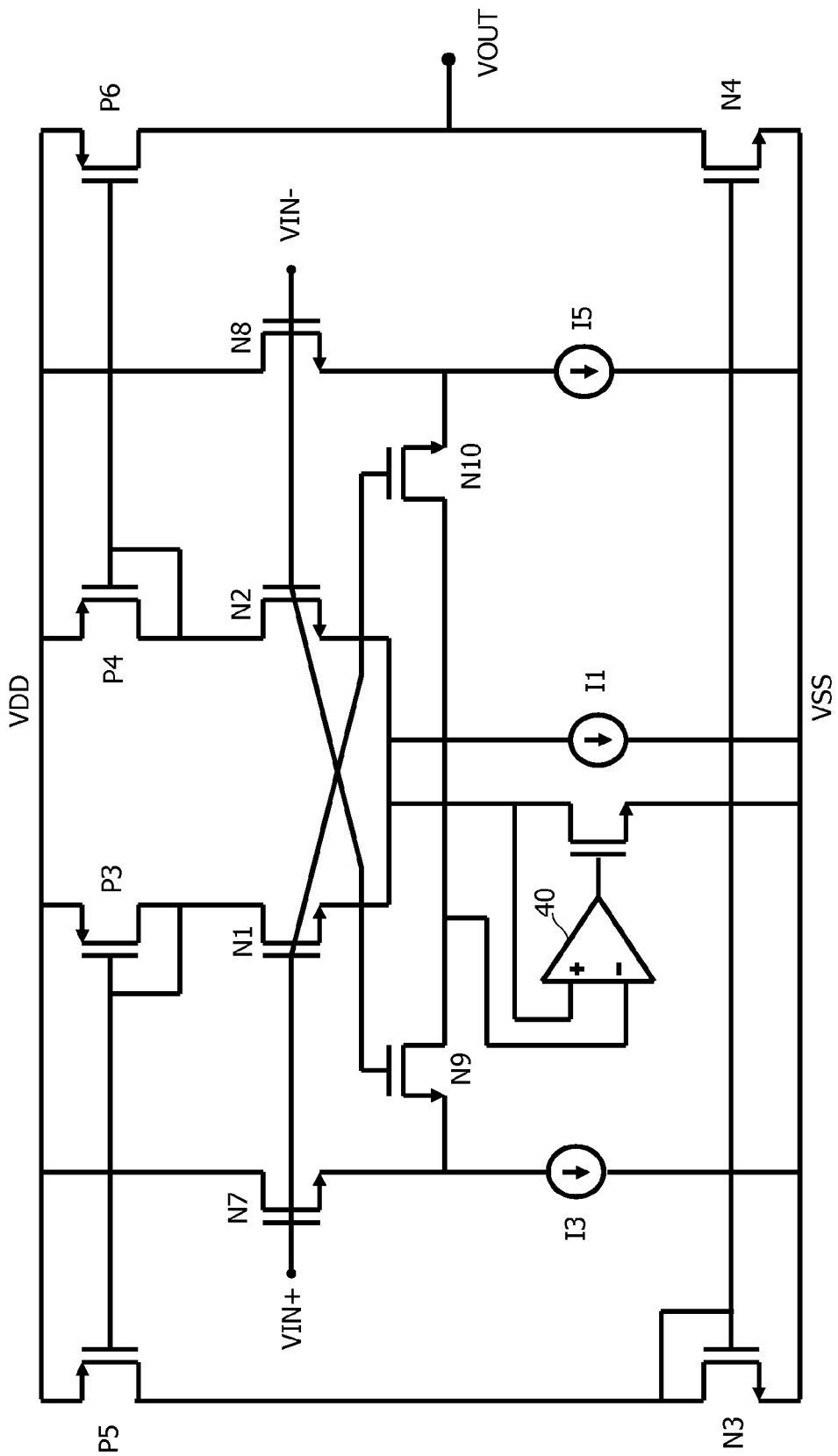
FIG. 8A is a circuit schematic depicting an embodiment of an amplifier including the boosted tail-current circuit depicted in FIG. 5.
Figure 8B:
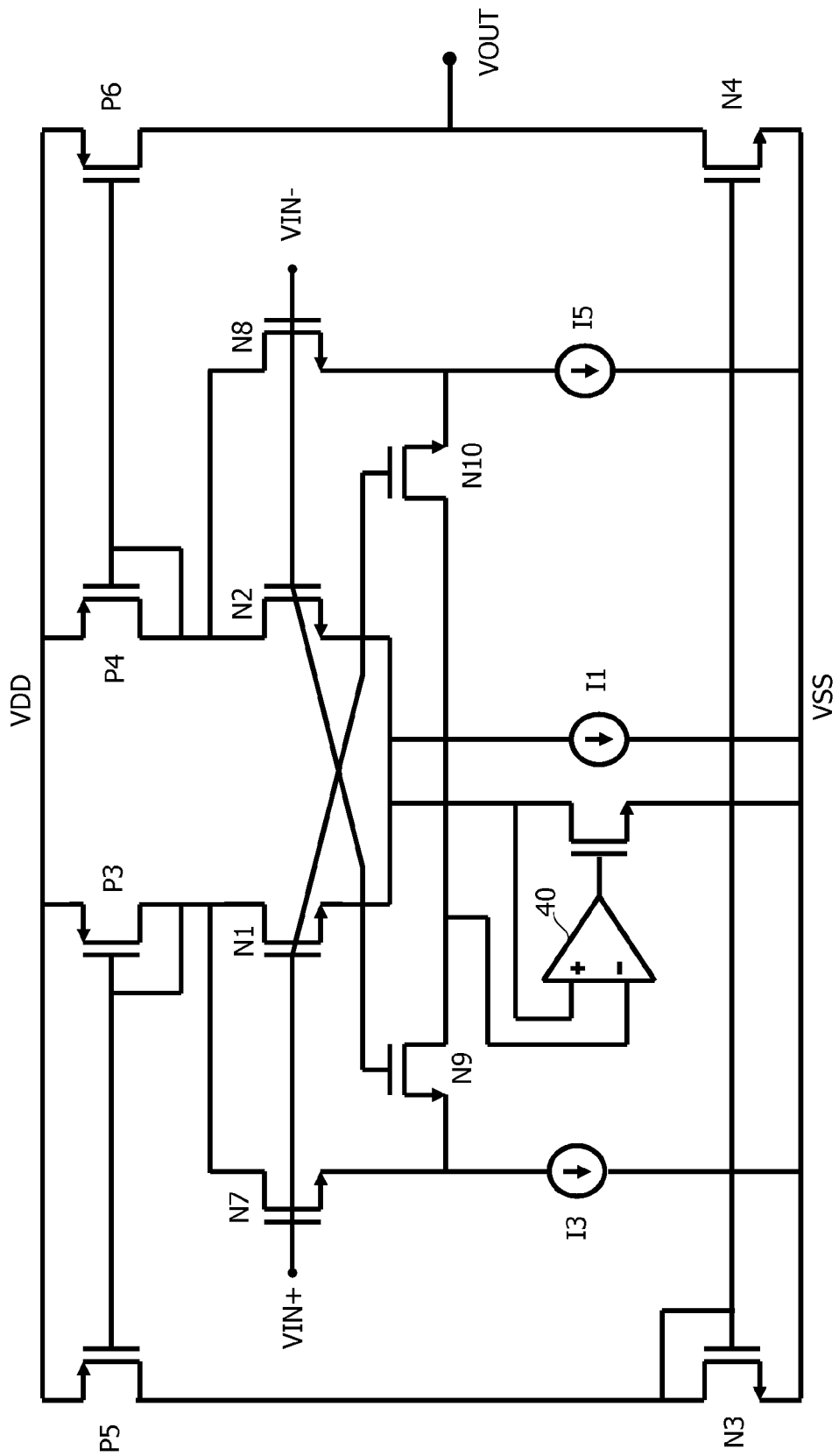
FIG. 8B is a circuit schematic depicting another embodiment of an amplifier including the boosted tail-current circuit depicted in FIG. 5.

FIG. 8A depicts the amplifier 28 having the embodiment of the boosted tail-current circuit 24 depicted in FIG. 5. In FIG. 8A, the embodiment of FIG. 5 is integrated into the amplifier 28 by connecting the drains of the first pair of NMOS transistors N7, N8 of the second current source I2 to the upper supply voltage VDD. FIG. 8B depicts another embodiment in which the drains of the first pair of NMOS transistors N7, N8 of the second current source I2 are connected to the drains of the differential-pair input transistors N1, N2. The decision to use either of the embodiments of FIGS. 8A and 8B can be evaluated according to bandwidth, slew rate, and power dissipation considerations.

Figure 9:
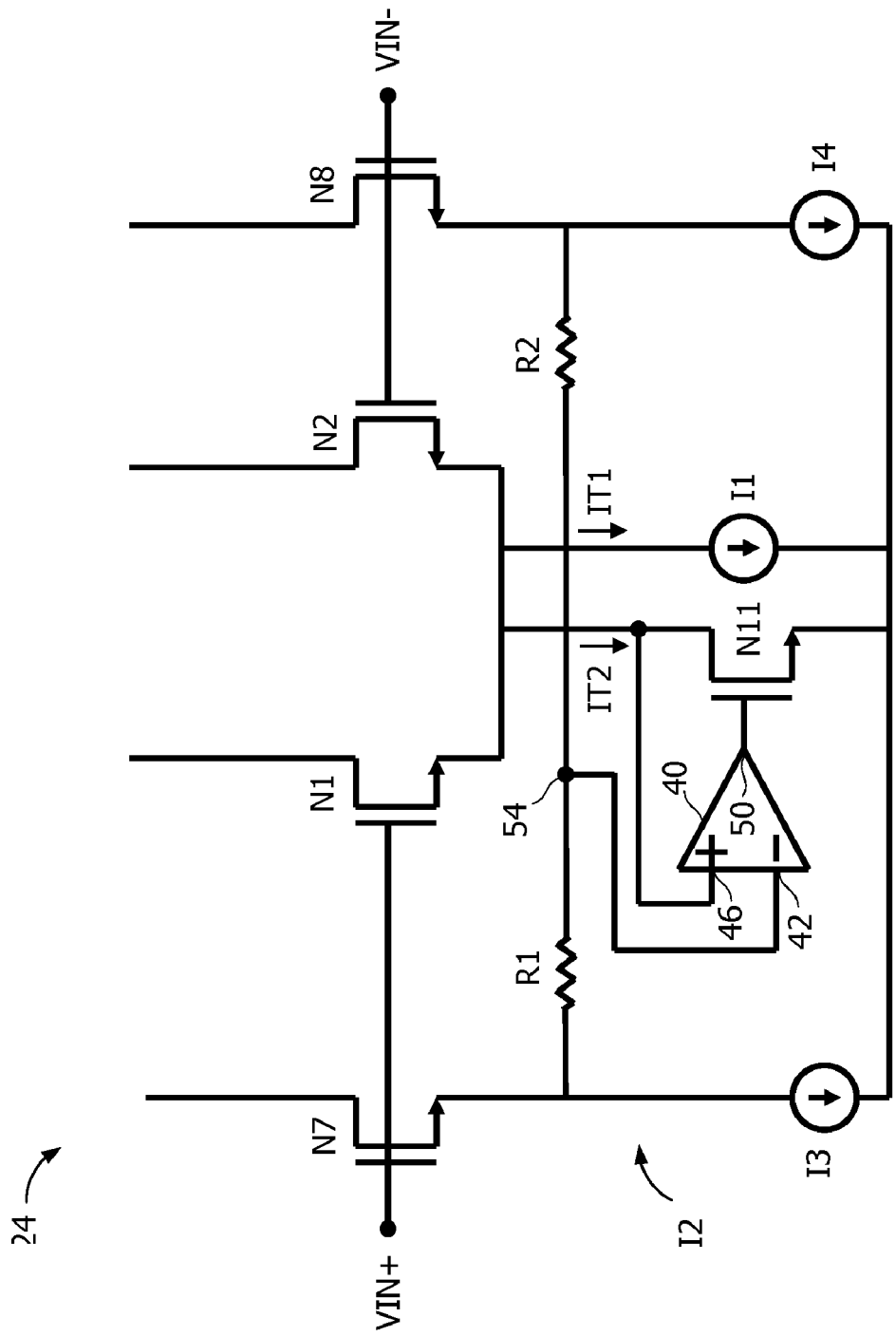
FIG. 9 is a circuit schematic depicting another embodiment the boosted tail-current circuit depicted in FIGS. 2A and 4.

FIG. 9 depicts another embodiment of the boosted tail-current circuit 24. The embodiment of FIG. 9 differs from that depicted in FIG. 5 in that the second pair of NMOS transistors N9, N10 of the second current source I2 are replaced with a pair of resistors R1, R2 having first terminals connected to the sources of the first pair of NMOS transistors N7, N8 and second terminals connected to each other. In the embodiment of FIG. 9, the feedback amplifier 40 has its negative input node 42 connected to the connected second terminals of the resistors R1, R2. One advantage of the embodiment of FIG. 9 may be that it can reduce the gain from the positive and negative voltage inputs VIN+ and VIN− to the gate of the current-supplying NMOS transistor N11, thereby possibly improving control of the transition between class-A and class-AB operating regions of the boosted tail-current circuit 24.

Figure 10:
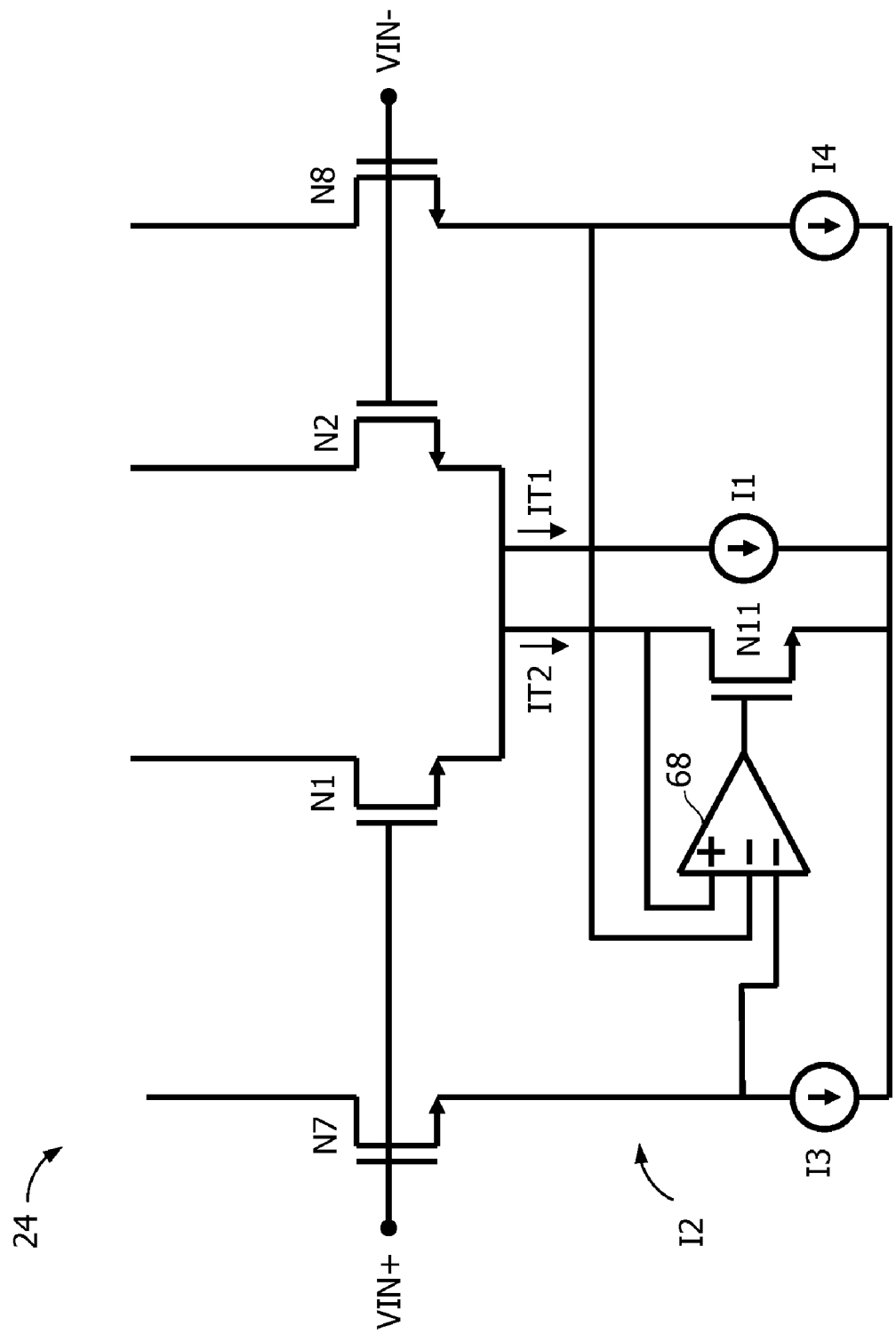
FIG. 10 is a circuit schematic depicting another embodiment the boosted tail-current circuit depicted in FIGS. 2A and 4.
Figure 11:
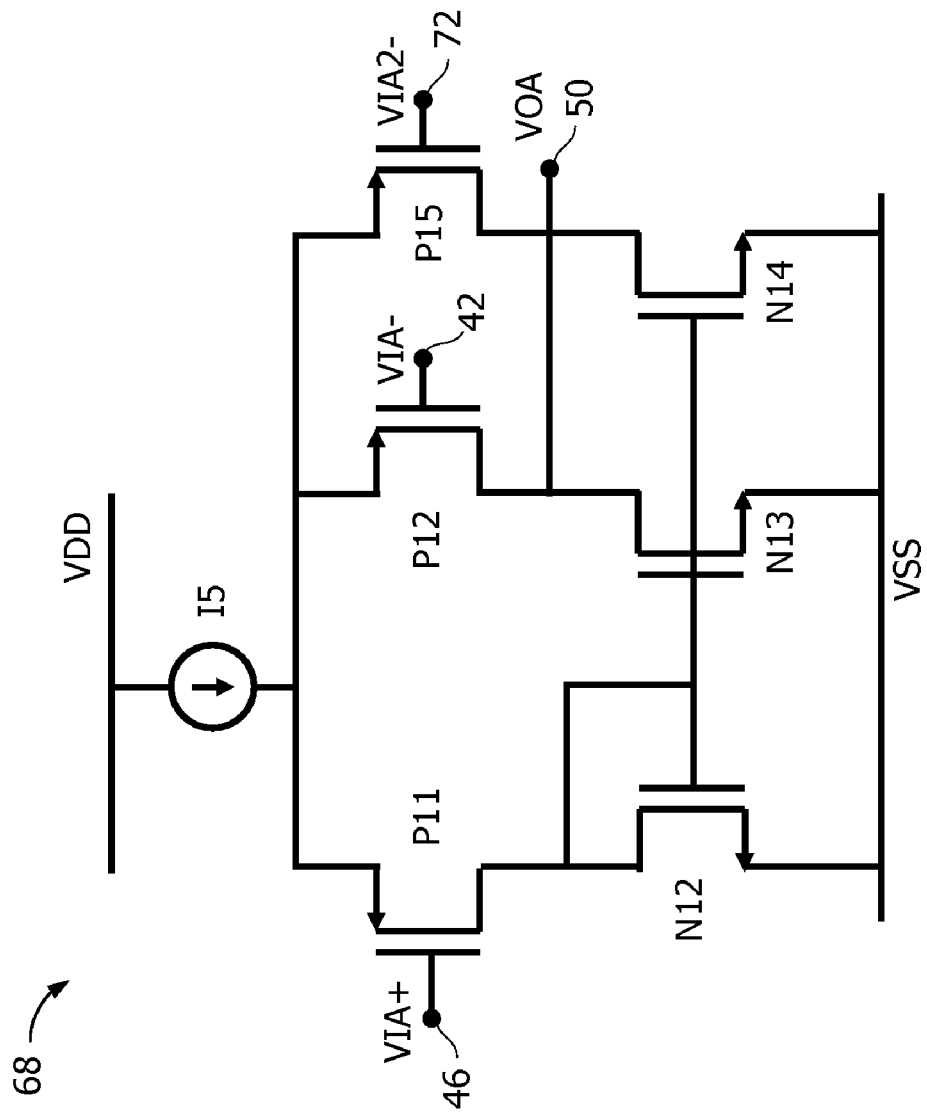
FIG. 11 is a circuit schematic depicting an embodiment of a three-input feedback amplifier of the boosted tail-current circuit depicted in FIG. 10.

FIG. 10 depicts another embodiment of the boosted tail-current circuit 24. The embodiment of FIG. 10 differs from that of FIG. 5 in that the second pair of NMOS transistors N9, N10 of the second current source I2 are removed and the sources of the first pair of NMOS transistors N7, N8 are each directly connected to two separate inverting inputs of a three-input feedback amplifier 68. FIG. 11 depicts an exemplary embodiment of the three-input feedback amplifier 68 that is a modification of the embodiment of the two-input feedback amplifier 40 of FIG. 6. The depicted embodiment includes an additional PMOS negative input transistor P15 (having a gate connected to the third, inverting terminal 72) and a corresponding additional NMOS active load transistor N14. The amplifier output 50 is now tied to both the PMOS negative input transistors P12, P15 and their active loads N13, N14. Note that, in another embodiment of the three-input feedback amplifier 68, the additional NMOS active load transistor N14 can be omitted and active load transistor N13 can instead be connected to both negative input transistors P12, P15.

Figure 12:
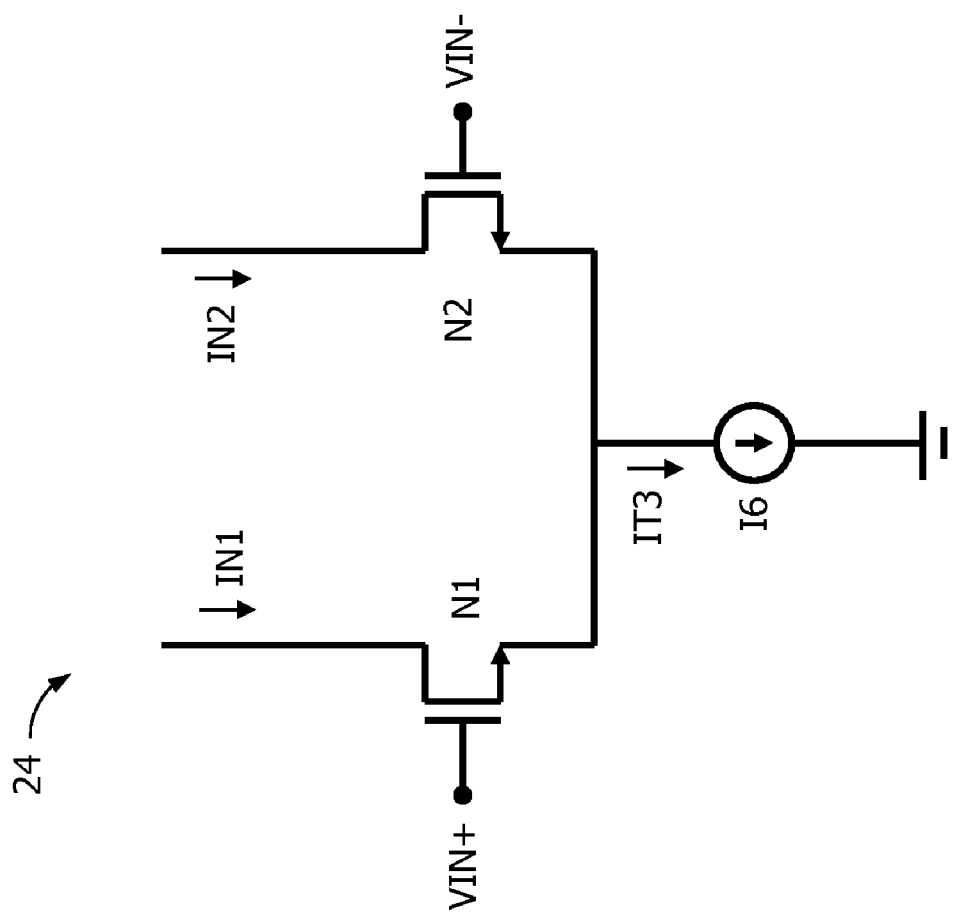
FIG. 12 is a circuit schematic depicting an embodiment of a boosted tail-current circuit having a class-AB current source.

FIG. 12 depicts another embodiment of the boosted tail-current circuit 24 in which the separate class-A first current source I1 and class-B second current source I2 are instead replaced with a single class-AB input-voltage-controlled third current source I6 configured to provide a class-AB tail current IT3 (wherein IT3=IT1+IT2) to the differential-pair input transistors N1, N2. The embodiment of FIG. 12 can be implemented using the same components depicted in FIG. 5, but with the separate class-A first current source I1 removed and the quiescent biasing and characteristics of the feedback amplifier 40 and current-supply NMOS transistor N11 adjusted to provide the quiescent portion of the tail current IT3. In such an embodiment, the offset voltage of the feedback amplifier 40 can still be selected to predetermine the magnitude of the input voltage VIN at which the class-AB current source begins to supply the non-quiescent input-voltage-controlled portion of the tail current IT3.

Figure 13:
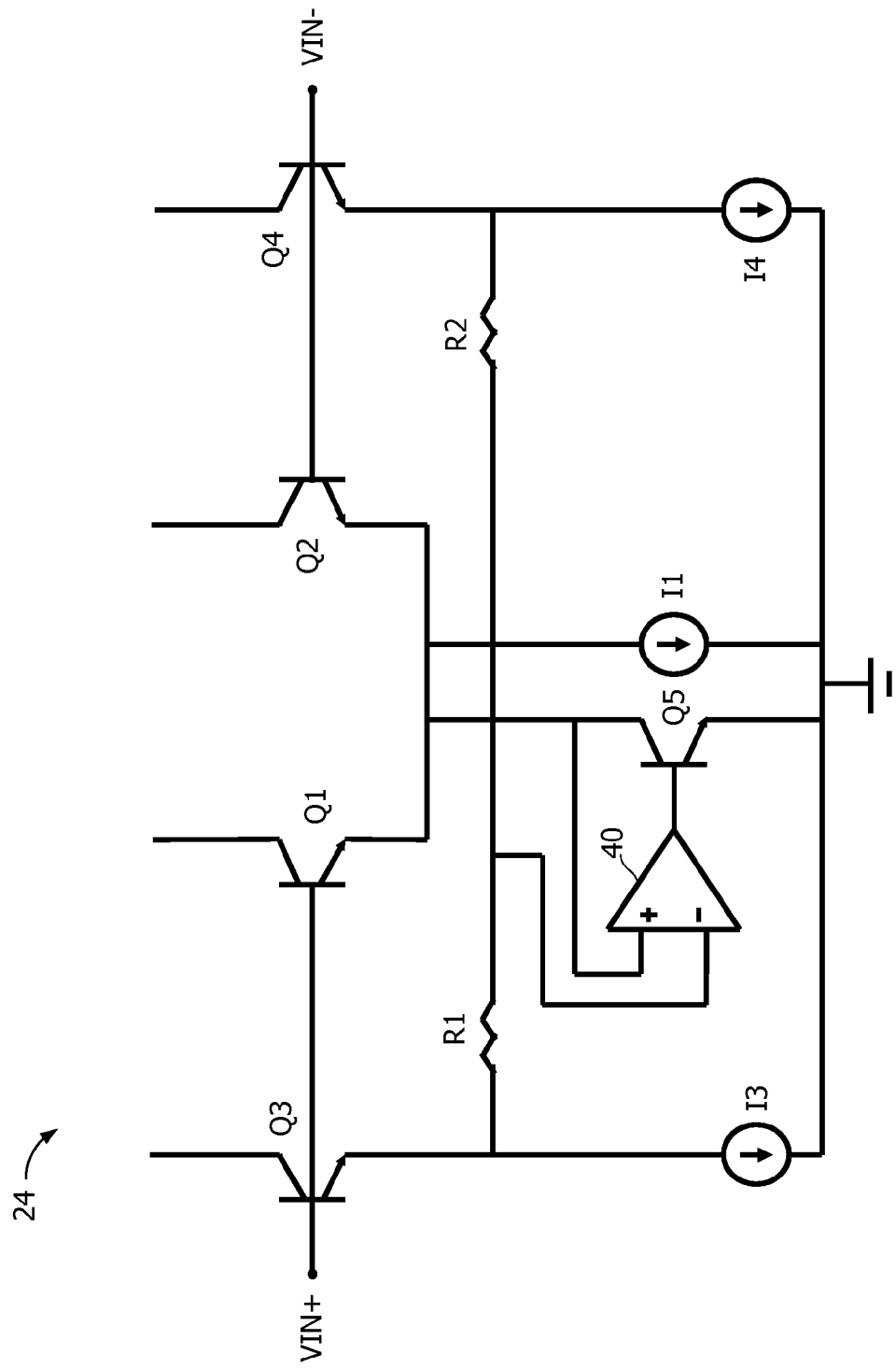
FIG. 13 is a circuit schematic depicting an embodiment the boosted tail-current circuit depicted in FIGS. 2A and 4 and having bipolar junction transistors.

FIG. 13 depicts another embodiment of the boosted tail-current circuit 24, modified from the embodiment of FIG. 9 to have bipolar junction transistors Q1, Q2, Q3, Q4, Q5 instead of corresponding NMOS transistors N1, N2, N7, N8, N11. Other embodiments exist in which only a subset of NMOS transistors, such as for example, only the differential-pair input transistors N1, N2, are replaced with bipolar transistors.

For purposes of this description, discussion of the configuration of the boosted tail-current circuit 24 can be generalized by use of the following terminology to refer to corresponding terminals of either a metal-oxide-semiconductor (MOS) transistor or a bipolar junction transistor (BJT). The term 'input terminal' can be used to designate either the gate terminal of a MOS transistor or the base terminal of a BJT. The term 'first output terminal' can be used to designate either the drain terminal of a MOS transistor or the collector terminal of a BJT. The term 'second output terminal' can be used to designate either the source terminal of a MOS transistor or the emitter terminal of a BJT. Note that the use of the term MOS can indicate either one or the other of an NMOS or a PMOS transistor. Note also that although MOS transistors are herein referred to as metal-oxide-semiconductor transistors, use of the term metal-oxide-semiconductor does not limit the transistor construction to having a metal gate. Instead, the terms MOS, NMOS and PMOS are used to indicate any type of transistor that is known in the art to be referred to by this term.

Figure 14:
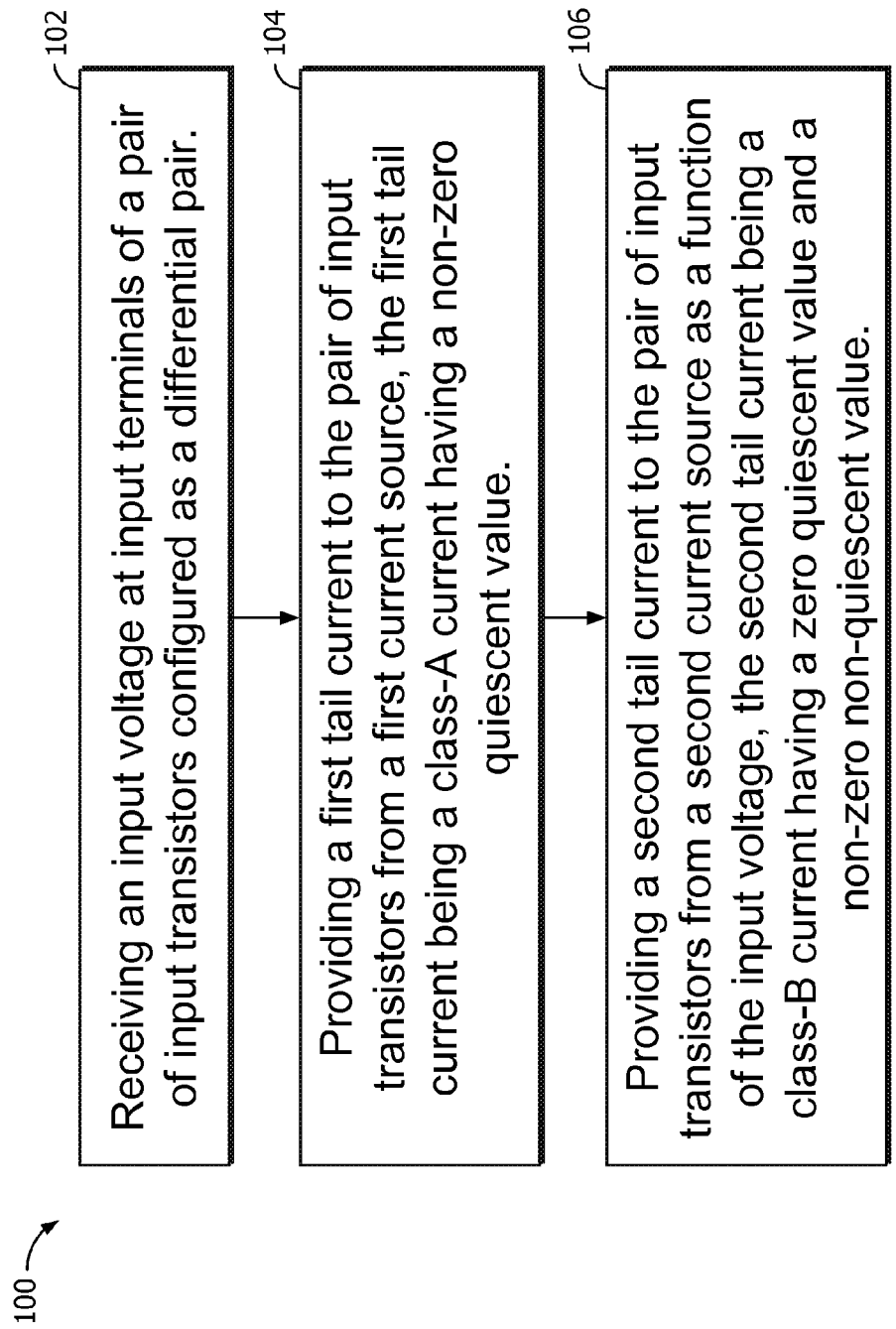
FIG. 14 is a flow chart depicting an embodiment of a method involving the boosted tail-current circuit depicted in FIGS. 2A and 4.

FIG. 14 is a flowchart depicting an embodiment of a method 100. In a first step 102, the method includes receiving the input voltage VIN at the input terminals of the pair of input transistors N1, N2 configured as the differential pair. In a second step 104, the method 100 includes providing the first tail current IT1 to the pair of input transistors N1, N2 from the first current source I1, the first tail current IT1 being the class-A current IT1 having the non-zero quiescent value. In a third step 106, the method 100 includes providing the second tail current IT2 to the pair of input transistors N1, N2 from the second current source I2 as a function of the input voltage VIN, the second tail current IT2 being the class-B current IT2 having the zero quiescent value and the non-zero non-quiescent value.

Further embodiments are also possible, which are the result of variously combining elements or embodiments described herein.

What is claimed is:

1. A circuit, comprising:
    a pair of input transistors configured as a differential pair and having input terminals configured to receive an input voltage;
    a first current source connected to and configured to provide a first tail current to the pair of input transistors, the first tail current being a class-A current having a non-zero quiescent value; and
    a second current source connected to and configured to provide a second tail current to the pair of input transistors, the second tail current being a class-B current having a zero quiescent value and a non-zero non-quiescent value, wherein the second current source is configured to provide the second tail current as a function of the input voltage.

2. The circuit of claim 1, wherein the second current source includes an absolute-value transconductor configured to receive the input voltage.

3. The circuit of claim 1, wherein the second current source includes:
    a first pair of MOS transistors having gates connected to the input terminals of the pair of input transistors;
    a second pair of MOS transistors having gates connected to the input terminals, sources connected to sources of the first pair of MOS transistors, and drains connected to each other;
    a feedback amplifier having a negative input node connected to the connected drains of the second pair of MOS transistors; and
    a current-supplying MOS transistor having a gate connected to an output of the feedback amplifier and a drain connected to and supplying the second tail current to the pair of input transistors.

4. The circuit of claim 3, wherein the drain of the current-supplying MOS transistor is connected to a positive input node of the feedback amplifier.

5. The circuit of claim 3, wherein the second current source is configured so that the current-supplying MOS transistor is turned off when the input voltage has a substantially zero value.

6. The circuit of claim 5, wherein the feedback amplifier has an input-referred offset voltage which is selectable to predetermine a threshold value of a magnitude of the input voltage at which the second current source begins to supply a non-zero non-quiescent second tail current.

7. The circuit of claim 6, wherein the offset voltage is selectable as an operating parameter during operation of the circuit.

8. The circuit of claim 7, wherein the feedback amplifier is configured to receive a selection signal at a switch and select the offset voltage as a function of the selection signal.

9. The circuit of claim 1, wherein the pair of input transistors are MOS transistors.

10. The circuit of claim 9, wherein drains of the pair of input transistors are connected to drains of the first pair of MOS transistors.

11. The circuit of claim 3, wherein the pair of input transistors, the first pair of MOS transistors, the second pair of MOS transistors and the current-supplying MOS transistor are all either NMOS or PMOS transistors.

12. The circuit of claim 1, wherein the second current source includes:
    a first pair of MOS transistors having gates connected to the input terminals of the pair of input transistors;
    a pair of resistors, each having first and second terminals, the first terminals being connected to sources of the first pair of MOS transistors and the second terminals being connected to each other;
    a feedback amplifier having a negative input node connected to the connected second terminals of the pair of resistors; and
    a current-supplying MOS transistor having a gate connected to an output of the feedback amplifier and a drain connected to and supplying the second tail current to the pair of input transistors, wherein the drain of the current-supplying MOS transistor is also connected to a positive input node of the feedback amplifier.

13. The circuit of claim 1, wherein the second current source includes:
    a first pair of transistors having input terminals connected to the input terminals of the pair of input transistors;
    a second pair of transistors having input terminals connected to the input terminals of the pair of input transistors, second output terminals connected to second output terminals of the first pair of transistors, and first output terminals connected to each other;
    a feedback amplifier having a negative input node connected to the connected first output terminals of the second pair of transistors; and
    a current-supplying transistor having an input terminal connected to an output of the feedback amplifier and a first output terminal connected to and supplying the second tail current to the pair of input transistors.

14. The circuit of claim 13, a bipolar junction transistor is included in at least one of: the pair of input transistors, the first pair of transistors, the second pair of transistors, or the current-supplying transistor.

15. A circuit, comprising:
    a pair of input transistors configured as a differential pair and having differential input terminals connected to and configured to receive an input voltage; and
    a class-AB current source connected to and configured to provide a tail current to the pair of input transistors, the tail current having a quiescent portion and a non-quiescent portion, wherein the non-quiescent portion is a function of the input voltage received at the differential input terminals.

16. The circuit of claim 15, wherein the class-AB current source includes:
    a first pair of MOS transistors having gates connected to the input terminals of the pair of input transistors;
    a second pair of MOS transistors having gates connected to the input terminals of the pair of input transistors, sources connected to sources of the first pair of MOS transistors, and drains connected to each other;
    a feedback amplifier having a negative input terminal connected to the connected drains of the second pair of MOS transistors; and
    a current-supplying MOS transistor having a gate connected to an output of the feedback amplifier and a drain connected to and supplying the second tail current to the pair of input transistors, wherein the drain is also connected to a positive input terminal of the feedback amplifier.

17. The circuit of claim 16, wherein the feedback amplifier has an input-referred offset voltage which is selectable to predetermine a threshold value of a magnitude of the input voltage at which the class-AB current source begins to supply the non-quiescent portion of the tail current.

18. A method, comprising:

receiving an input voltage at input terminals of a pair of input transistors configured as a differential pair;

providing a first tail current to the pair of input transistors from a first current source, the first tail current being a class-A current having a non-zero quiescent value; and providing a second tail current to the pair of input transistors from a second current source as a function of the input voltage, the second tail current being a class-B current having a zero quiescent value and a non-zero non-quiescent value.

19. The method of claim 18, further including:

connecting gates of a first pair of MOS transistors to the input terminals of the pair of input transistors;

connecting gates of a second pair of MOS transistors to the input terminals, sources of the second pair of MOS transistors to sources of the first pair of MOS transistors, and drains of the second pair of MOS transistors to each other;

connecting a negative input terminal of a feedback amplifier to the connected drains of the second pair of MOS transistors; and connecting a gate of a current-supplying MOS transistor to an output of the feedback amplifier and a drain of the current-supplying MOS transistor to the pair of input transistors to supply the second tail current to the pair of input transistors.

20. The method of claim 19, further including selecting an input-referred offset voltage of the feedback amplifier to predetermine a threshold value of a magnitude of the input voltage at which the second current source begins to supply a non-zero non-quiescent second tail current.

* * * * *